(12) United States Patent
Carlson et al.

(10) Patent No.: US 8,590,333 B2
(45) Date of Patent: Nov. 26, 2013

(54) DATA CENTER COOLING

(75) Inventors: Andrew B. Carlson, Atherton, CA (US); Jimmy Clidaras, Los Altos, CA (US)

(73) Assignee: Exaflop LLC, Mountain View, CA (US)

( * ) Notice: Subject to any disclaimer, the term of this patent is extended or adjusted under 35 U.S.C. 154(b) by 143 days.

(21) Appl. No.: 13/372,100

(22) Filed: Feb. 13, 2012

(65) Prior Publication Data
US 2012/0138259 A1    Jun. 7, 2012

Related U.S. Application Data

(63) Continuation of application No. 12/611,069, filed on Nov. 2, 2009, now Pat. No. 8,113,010.

(51) Int. Cl.
*F25D 23/12* (2006.01)

(52) U.S. Cl.
USPC .................... 62/259.2; 62/99; 62/168

(58) Field of Classification Search
USPC ........... 62/99, 168, 259.2, 503, 507; 361/689, 361/694, 696
See application file for complete search history.

(56) References Cited

U.S. PATENT DOCUMENTS

| | | | |
|---|---|---|---|
| 5,544,012 A | 8/1996 | Koike | |
| 5,718,628 A | 2/1998 | Nakazato et al. | |
| 7,088,585 B2 | 8/2006 | Chu et al. | |
| 7,197,433 B2 * | 3/2007 | Patel et al. | 702/188 |
| 7,266,964 B2 * | 9/2007 | Vogel et al. | 62/259.2 |
| 7,315,448 B1 * | 1/2008 | Bash et al. | 361/701 |
| 7,500,911 B2 | 3/2009 | Johnson et al. | |
| 7,542,285 B2 | 6/2009 | Colucci et al. | |
| 8,453,469 B1 * | 6/2013 | Carlson et al. | 62/91 |
| 8,469,782 B1 * | 6/2013 | Roy | 454/187 |
| 2003/0173688 A1 | 9/2003 | Koo | |
| 2003/0221821 A1 | 12/2003 | Patel et al. | |
| 2004/0112582 A1 | 6/2004 | Beitelmal et al. | |
| 2006/0168975 A1 | 8/2006 | Malone et al. | |

(Continued)

FOREIGN PATENT DOCUMENTS

| | | |
|---|---|---|
| JP | 2005191554 | 7/2005 |
| JP | 2006208000 | 8/2006 |
| WO | WO 2011/053992 | 5/2011 |

OTHER PUBLICATIONS

Notification of Transmittal of the International Search Report and the Written Opinion of the International Searching Authority, or Declaration (2 pages); International Search Report (3 pages); and Written Opinion of the International Searching Authority (3 pages), mailed Jul. 5, 2011, for related international application PCT/US2010/055139.

Authorized Officer A. Nickitas-Etienne. International Preliminary Report on Patentability in International Application No. PCT/US2010/055139, dated May 8, 2012, 5 pages.

Authorized Officer G. Jang. International Search Report and Written Opinion in International Application No. PCT/US2010/055147, dated Jul. 7, 2011, 9 pages.

(Continued)

*Primary Examiner* — Melvin Jones
(74) *Attorney, Agent, or Firm* — Fish & Richardson P.C.

(57) ABSTRACT

A system for cooling air in a data center includes a data center having electronic equipment in operation, a cooling water source, and a plurality of on-floor cooling units. The cooling water source is configured to retain at maximum capacity a total amount of water. Each on-floor cooling unit is configured to cool air heated by a portion of the electronic equipment in the data center using water from the cooling water source. The total amount of water is insufficient to maintain a leaving air temperature of each on-floor cooling unit below an inside setpoint when a temperature outside of the data center is above a predetermined external temperature.

18 Claims, 8 Drawing Sheets

(56) References Cited

U.S. PATENT DOCUMENTS

| | | |
|---|---|---|
| 2008/0198549 A1 | 8/2008 | Rasmussen et al. |
| 2009/0112522 A1 | 4/2009 | Rasmussen |
| 2009/0251860 A1 | 10/2009 | Belady et al. |
| 2011/0100618 A1 | 5/2011 | Carlson |

OTHER PUBLICATIONS

Authorized Officer A. Nickitas-Etienne. International Preliminary Report on Patentability in International Application No. PCT/US2010/055147, May 8, 2012, 6 pages.

* cited by examiner

DATA CENTER COOLING

CROSS REFERENCE TO RELATED APPLICATION

This application is a continuation of, and therefore claims priority under 35 U.S.C. §120 to, U.S. patent application Ser. No. 12/611,069, filed on Nov. 2, 2009, now U.S. Pat. No. 8,113,010, the entire contents of which are incorporated by reference as if fully set forth herein.

TECHNICAL FIELD

This document relates to systems and methods for providing cooling for areas containing electronic equipment, such as computer server rooms and server racks in computer data centers.

BACKGROUND

Computer users often focus on the speed of computer microprocessors (e.g., megahertz and gigahertz). Many forget that this speed often comes with a cost—higher electrical power consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, for the most part, conversion into heat. A pair of microprocessors mounted on a single motherboard can draw 200-400 watts or more of power. Multiply that figure by several thousand (or tens of thousands) to account for the many computers in a large data center, and one can readily appreciate the amount of heat that can be generated. It is much like having a room filled with thousands of burning floodlights.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause great increases in microprocessor errors and failures. In sum, such a system may require electricity to run the chips, and more electricity to cool the chips.

SUMMARY

In general, in one aspect, a system for providing cooled air to a data center includes a data center having electronic equipment in operation, a cooling water source, a plurality of on-floor cooling units in the data center, a plurality of proportioning control valves, and a controller. Each on-floor cooling unit is configured to cool air warmed by a sub-set of the electronic equipment in the data center. Each proportioning control valve is associated with a single on-floor cooling unit. Each proportioning control valve is configured to turn in response to a signal from the controller, the valve able to be fully closed, fully open, or partially open. When the valve is closed, water is blocked from the on-floor cooling unit. When the valve is fully open, a maximum volume of water is circulated through the on-floor cooling unit. When the valve is partially open, some percent less than 100% of the maximum amount of water is circulated through the on-floor cooling unit. The controller is configured to turn the corresponding control valve in response to a change in temperature.

This and other embodiments can optionally include one or more of the following features. The controller can be configured to turn the corresponding control valve in response to a change in a leaving air temperature of the corresponding on-floor cooling unit. The controller can be configured to turn the corresponding control valve such that the leaving temperature of the corresponding on-floor cooling unit remains below an inside setpoint for at least 90% of the operating time of the system. The system can further include a plurality of sensors, each sensor configured to measure the leaving air temperature of an on-floor cooling unit. The proportioning valve can act independently of any other control valve. The cooling water source can include a cooling tower. Each on-floor cooing unit can include a heat exchanger configured to transfer heat from the electronic equipment to the cooling water source. The heat exchange can include coils located adjacent to one or more common hot air plenums that receive heated air from the electronic equipment.

In general, in one aspect, a system for providing cooled air to electronic equipment includes a data center having electronic equipment in operation, a plurality of modules connected by a first head, and at least one chiller connected by a second header. Each module includes a plurality of on-floor cooling units in the data center and a cooling water source. The at least one chiller is in fluid connection with one or more than one module in the plurality of modules.

This and other embodiments can optionally include one or more of the following features. The number of chillers can be less than the number of modules. Each on-floor cooling unit can include a corresponding proportioning control valve configured to control the flow of water through the on-floor cooling unit. The cooling water source can be a cooling tower. Each on-floor cooling unit can include a heat exchanger configured to transfer heat from the electronic equipment to the cooling water source. The heat exchanger can include coils located adjacent to one or more common hot air plenums that receive heated air from the electronic equipment.

In general, in one aspect, a system for cooling air in a data center includes a data center having electronic equipment in operation, a cooling water source, and a plurality of on-floor cooling units. The cooling water source is configured to retain at maximum capacity a total amount of water. Each on-floor cooling unit is configured to cool air heated by a portion of the electronic equipment in the data center using water from the cooling water source. The total amount of water is insufficient to maintain a leaving air temperature of each on-floor cooling unit below an inside setpoint when a temperature outside of the data center is above a predetermined external temperature.

This and other embodiments can optionally include one or more of the following features. The cooling water source can be a cooling tower. Each on-floor cooling unit can include a heat exchanger configured to transfer heat from the electronic equipment to the cooling water source. The heat exchanger can include coils located adjacent to one or more common hot air plenums that receive heated air from the electronic equipment. The system can be is located in a geographical region, and for at least 90% of a year, temperatures outside of the data center can be below the predetermined external temperature. At least 95% of the year, temperatures outside of the data center can be below the predetermined external temperature.

Advantages of the systems and methods described herein may include one or more of the following. If the temperature inside the data center is allowed to rise above the inside setpoint for short periods of time, then the use of expensive chillers can be minimized. By monitoring the leaving air temperature, e.g. the temperature of the air leaving a the cooling coil or cool air plenum of the on-floor cooling unit, rather than the temperature of individual servers, the temperature indication will be more accurate, making the cooling system more efficient. If control valves are configured to individually control the flow of water to each on-floor cooling unit, the total amount of water required for the system can be reduced. By connecting chillers to a separate header, corresponding modules, e.g. modules which include a series of cooling units, control valves, and a modular cooling plant, can remain on-line even when the corresponding modular cooling plant fails.

The details of one or more embodiments are set forth in the accompanying drawings and the description below. Other features and advantages will be apparent from the description and drawings, and from the claims.

DETAILED DESCRIPTION

Figure 1:
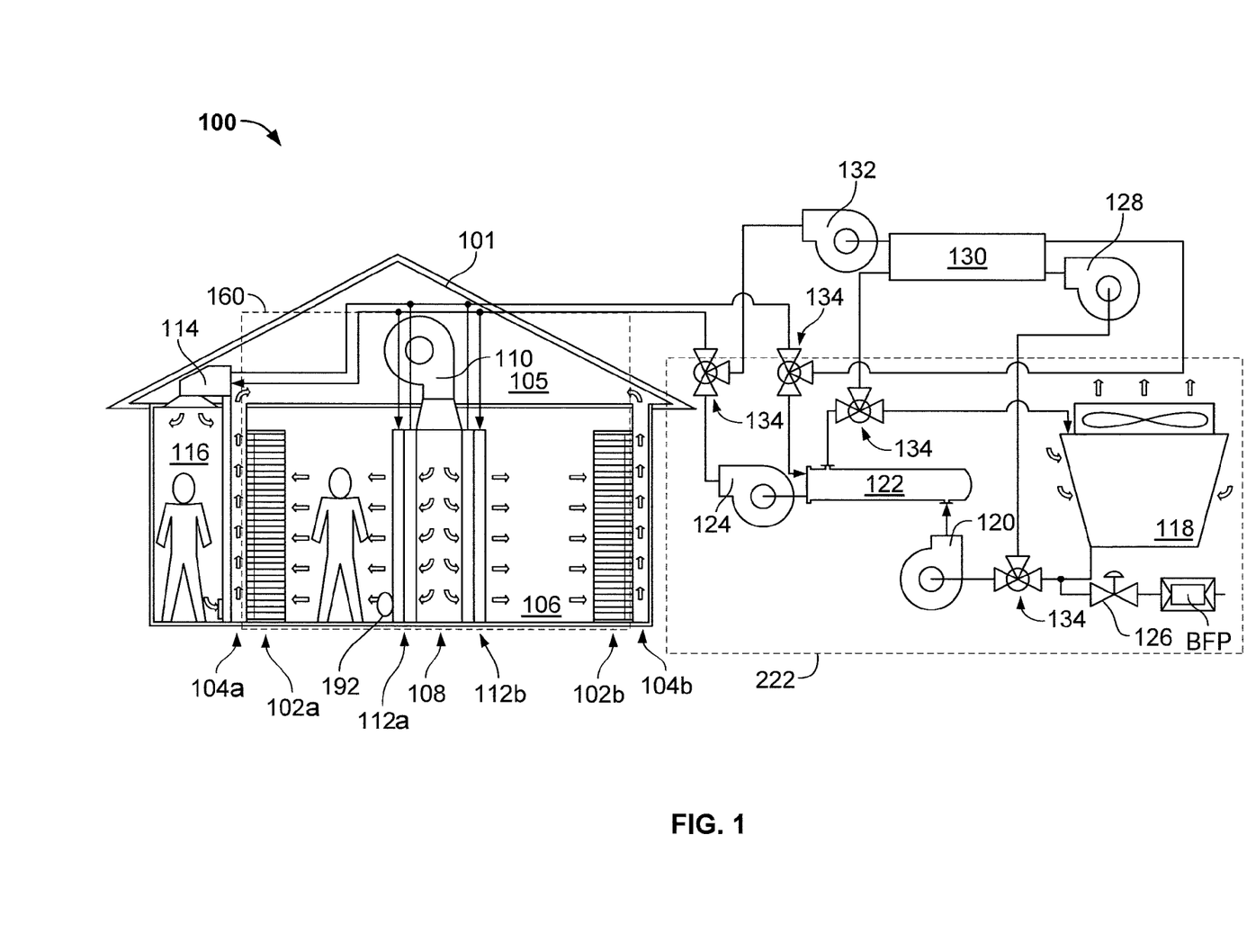
FIG. 1 is a schematic diagram showing a system for cooling a computer data center.

FIG. 1 is a schematic diagram showing a system 100 for cooling a computer data center 101. The system 100 generally includes an on-floor cooling unit 160 having an air handling unit (including e.g., fan 110 and cooling coils 112a, 112b) for transferring heat from the data center's air to cooling water. System 100 can also include a modular cooling plant 222. Modular cooling plant 222 can include a power and cooling unit ("PCU") having pumps 124, 120, valves 134, filters (not shown), and a heat exchanger 122 for removing heat from the cooling water and passing it to condenser water that is delivered to a cooling tower 118 in modular cooling plant 222. The cooling tower 118 in modular cooling plant 222 a cooling water tower, a dry cooler including only a fan coil unit, or a hybrid tower including both a cooling water tower and a dry cooler. Alternatively, a cool water source such as a lake or bay can be used instead of a cooling tower 118. The cooling water 118 in modular cooling plant 222 passes the accumulated heat to the ambient air through evaporation and cooling of the cooling tower water to create cooled water. In general operation, the system 100 operates using only the cooling tower/heat exchanger/cooling coil system, though a powered refrigeration system such as a chiller may be used to provide chilled water during peak loads, such as when the outdoor ambient dew point is very high and the cooling tower cannot provide sufficient cooling alone. As explained below, control parameters for the system may also be set so as to avoid most or any need for the use of chillers or other such powered refrigeration systems.

The temperatures of each portion of the system 100 are selected to be relatively high (compared to conventional refrigeration-based cooling systems), so as to permit more efficient operation of the system 100. For example, relatively high air temperatures in the system (e.g., air entering a cooling coil over 110° F. (43.3° C.) and exiting the coil at a temperature above 70° F. (21.11° C.)) may in turn permit for relatively high cooling water temperatures (e.g., water entering a cooling coil around 68° F. (20° C.) and exiting around 104° F. (40° C.)) because the amount of heat that can be taken out of the air is generally proportional to the difference in temperature between the water and the air. If the difference can be kept at an acceptable level, where the temperatures are high enough that evaporative cooling (e.g., cooling through a cooling tower, without further cooling via chiller) is sufficient, the relatively high electrical cost of operating a chiller (or many chillers) may be avoided.

High system temperatures may be particularly advantageous in certain implementations when hybrid cooling towers are used. Such hybrid cooling towers combine the functionality of an ordinary cooling tower with a water-to-water heat exchanger. Using a sufficiently high temperature setpoint, i.e. the maximum temperature at which the data center 101 is allowed to operate for the majority of the operating time of the electronic equipment, may allow the hybrid tower to provide substantial cooling capacity, even when operating in a water-to-air mode without utility water. As a result, a hybrid cooling tower may be used to provide cooling capacity to a facility relatively quickly, even before utility water may be obtained in large volumes. The capacity of the cooling tower may be directly related to the difference in the temperature of the water within it to the ambient outside air.

When the difference in temperatures is not very large, a change of only a few degrees can bring substantial gains in efficiency. For example, where the cooling water enters at 68° F. (20° C.), by heating air to 113° F. (45° C.) rather than 104° F. (40° C.), the temperature difference is increased from 36° F. to 45° F. (20° C. to 45° C.)—which may result in an increase in heat flow of 25 percent. The actual difference will vary slightly, as the entering conditions for air and water are not the only conditions (because the air cools as it passes through a cooling coil, and the water warms); this example, however, indicates how the difference in temperature can affect efficiency of a system.

Use of elevated temperatures in a system may also prevent air in or around the system from falling below its liquid saturation point, i.e., its dew point, and condensing. This may, in certain circumstances, provide benefits both in efficiency and in operation of the system. Efficiency benefits may be obtained because creating condensation requires much more energy than simply cooling air, so that systems creating condensation may use a large amount of electricity or other energy. Improvements in operation of the system may occur because, if pipes in the system carry water that is below the saturation temperature of the air around the pipes, condensation might form on the pipes. That condensation can damage the pipes or equipment in the conditioned space, cause mold, and cause water to pool on the floor, and can require the installation of insulation on the pipes (to stop the condensation).

In the system shown in FIG. 1, use of elevated temperatures may substantially reduce, or almost entirely eliminate, the need for energy-intensive cooling components such as chillers and the like, even where the heat load in the data center 101 is very high. As a result, system 100 may be operated at a lower operating cost than could otherwise be achieved. In addition, lower capital costs may be required, because fans, coils, heat exchangers, and cooling towers are relatively basic and inexpensive components. In addition, by operating with a higher temperature difference between cooled air and cooling water, less volume of cooling water is needed, thus reducing the size and cost of piping, and the cost to operate pumps and other such components.

In addition, those components are often very standardized, so that their acquisition costs are lower, and they are more easily located, particularly in developing countries and remote areas where it may be beneficial to place a data center 101. Use of system 100 in remote areas and other areas with limited access to electrical power is also helped by the fact that system 100 may be operated using less electrical power. As a result, such a system can be located near lower-power electrical sub-stations and the like. As discussed more completely below, lower-powered systems may also be amenable to being implemented as self-powered systems using energy sources such as solar, wind, natural-gas powered turbines, fuel cells, and the like.

Referring now to FIG. 1, there is shown a data center 101 in sectional view, which as shown, is a building that houses a large number of computers or similar heat-generating electronic components. A workspace 106 is defined around the computers, which are arranged in a number of parallel rows and mounted in vertical racks, such as racks 102a, 102b. The racks may include pairs of vertical rails to which are attached paired mounting brackets (not shown). Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 106 across the trays and through on-floor cooling unit 160. Although only one on-floor cooling unit 160 is shown in FIG. 160, data center 101 can include multiple on-floor cooling units 160. On-floor cooling unit 160 includes warm-air plenums 104a, 104b behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 106 is known, controlling the exhaust temperature also indirectly controls the temperature rise. The work space 106 may, in certain circumstances, be referenced as a "cold aisle," and the plenums 104a, 104b as "warm aisles."

The temperature rise can be large. For example, the work space 106 temperature may be about 77° F. (25° C.) and the exhaust temperature into the warm-air plenums 104a, 104b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but also uses a lot of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air may be routed upward into a ceiling area, or attic 105, or into a raised floor or basement, or other appropriate space, and may be gathered there by air handling units that include, for example, fan 110 of on-floor cooling unit 160, which may include, for example, one or more centrifugal fans appropriately sized for the task. The fan 110 may then deliver the air back into a plenum 108 located adjacent to the workspace 106. The plenum 108 may be simply a bay-sized area in the middle of a row of racks, that has been left empty of racks, and that has been isolated from any warm-air plenums on either side of it, and from cold-air work space 106 on its other sides. Alternatively, air may be cooled by coils defining a border of warm-air plenums 104a, 104b and expelled directly into workspace 106, such as at the tops of warm-air plenums 104a, 104b.

On-floor cooling unit 160 can also have cooling coils 112a, 112b located on opposed sides of the plenum approximately flush with the fronts of the racks. (The racks in the same row as the plenum 108, coming in and out of the page in the figure, are not shown.) The coils may have a large surface area and be very thin so as to present a low pressure drop to the system 100. In this way, slower, smaller, and quieter fans may be used to drive air through the system. Protective structures such as louvers or wire mesh may be placed in front of the coils 112a, 112b to prevent them from being damaged.

In operation, fan 110 of on-floor cooling unit 160 pushes air down into plenum 108, causing increased pressure in plenum 108 to push air out through cooling coils 112a, 112b. As the air passes through the coils 112a, 112b, its heat is transferred into the water in the coils 112a, 112b, and the air is cooled.

The speed of the fan 110 and/or the flow rate or temperature of cooling water flowing in the cooling coils 112a, 112b may be controlled in response to measured values. For example, the pumps driving the cooling liquid may be variable speed pumps that are controlled to maintain a particular temperature in work space 106. Such control mechanisms may be used to maintain a constant temperature in workspace 106 or plenums 104a, 104b and attic 105.

The workspace 106 air may then be drawn into racks 102a, 102b such as by fans mounted on the many trays that are mounted in racks 102a, 102b. This air may be heated as it passes over the trays and through power supplies running the computers on the trays, and may then enter the warm-air plenums 104a, 104b. Each tray may have its own power supply and fan or fans. In some implementation, the power supply is located at the back edge of the tray, and the is fan attached to the back of the power supply. All of the fans may be configured or programmed to deliver air at a single common temperature, such as at a set 113° F. (45° C.). The process may then be continuously readjusted as fan 110 captures and circulates the warm air.

Additional items may also be cooled using system 100. For example, room 116 is provided with a self-contained fan-coil unit 114 which contains a fan and a cooling coil. The unit 114 may operate, for example, in response to a thermostat provided in room 116. Room 116 may be, for example, an office or other workspace ancillary to the main portions of the data center 101.

In addition, supplemental cooling may also be provided to room 116 if necessary. For example, a standard roof-top or similar air-conditioning unit (not shown) may be installed to provide particular cooling needs on a spot basis. As one example, system 100 may be designed to deliver 78° F. (25.56° C.) supply air to work space 106, and workers may prefer to have an office in room 116 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 100.

Fresh air may be provided to the workspace 106 by various mechanisms. For example, a supplemental air-conditioning unit (not shown), such as a standard roof-top unit may be provided to supply necessary exchanges of outside air. Also, such a unit may serve to dehumidify the workspace 106 for the limited latent loads in the system 100, such as human perspiration. Alternatively, louvers may be provided from the outside environment to the system 100, such as powered louvers to connect to the warm air plenum 104b. System 100 may be controlled to draw air through the plenums when environmental (outside) ambient humidity and temperature are sufficiently low to permit cooling with outside air. Such louvers may also be ducted to fan 110, and warm air in plenums 104a, 104b may simply be exhausted to atmosphere, so that the outside air does not mix with, and get diluted by, the warm air from the computers. Appropriate filtration may also be provided in the system, particularly where outside air is used.

Also, the workspace 106 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from modular cooling plant 222 that can include a cooling water circuit and a condenser water circuit. Cooling water circuit can be powered by pump 124. The cooling water circuit may be formed as a direct-return, or indirect-return, circuit, and may generally be a closed-loop system. Pump 124 may take any appropriate form, such as a standard centrifugal pump. Heat exchanger 122 may remove heat from the cooling water in the circuit. Heat exchanger 122 may take any appropriate form, such as a plate-and-frame heat exchanger or a shell-and-tube heat exchanger.

Heat may be passed from the cooling water circuit to a condenser water circuit that includes heat exchanger 122, pump 120, and cooling tower 118. Pump 120 may also take any appropriate form, such as a centrifugal pump. Cooling tower 118 may be, for example, one or more forced draft towers or induced draft towers. The cooling tower 118 may be considered a free cooling source, because it requires power only for movement of the water in the system and in some implementations the powering of a fan to cause evaporation; it does not require operation of a compressor in a chiller or similar structure.

The cooling tower 118 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 122, and routing cooling tower water (condenser water) directly to cooling coils 112a, 112b (not shown). Such an implementation may be more efficient, as it removes one heat exchanging step. However, such an implementation also causes water from the cooling tower 118 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 126 is provided in the condenser water circuit to supply make-up water to the circuit. Make-up water may generally be needed because cooling tower 118 operates by evaporating large amounts of water from the circuit. The control valve 126 may be tied to a water level sensor in cooling tower 118, or to a basin shared by multiple cooling towers. When the water falls below a predetermined level, control valve 126 may be caused to open and supply additional makeup water to the circuit. A back-flow preventer (BFP) may also be provided in the make-up water line to prevent flow of water back from cooling tower 118 to a main water system, which may cause contamination of such a water system.

Figure 2A:
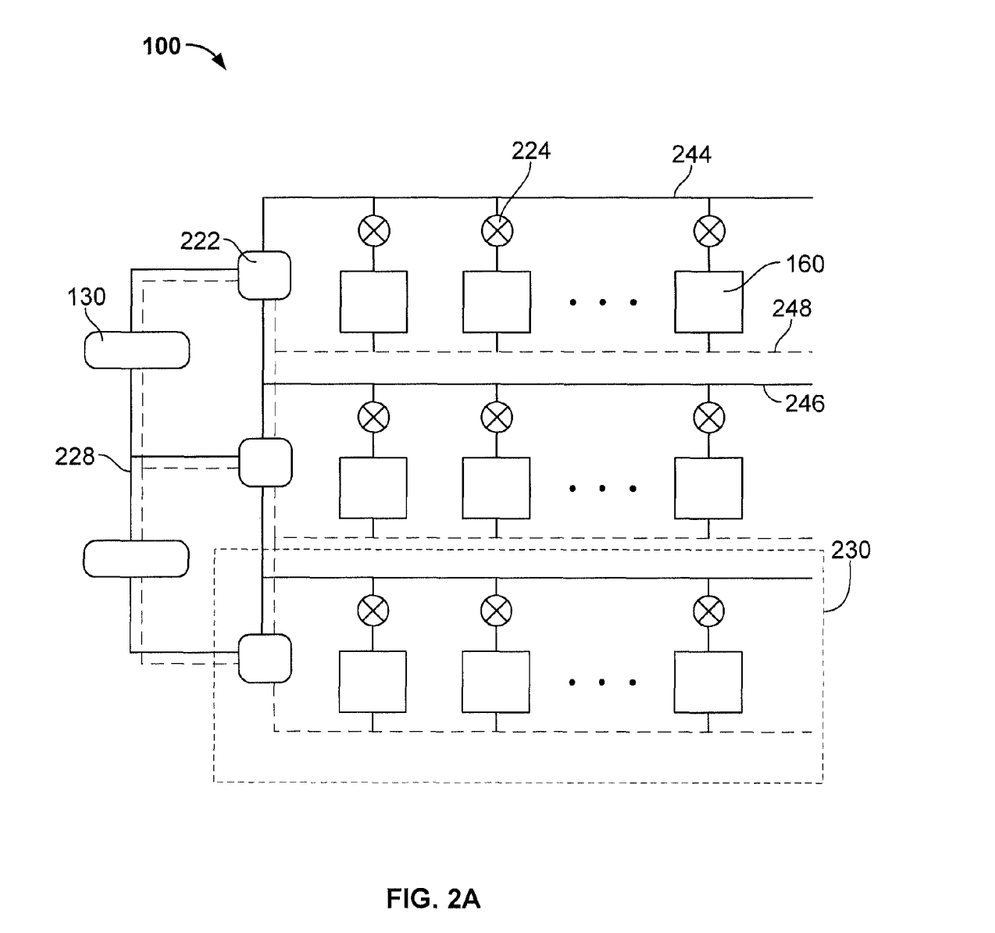
FIG. 2A is a schematic diagram showing a system for cooling server racks in a data center.

Although FIG. 1 shows the modular cooling plant 222 connected to only one on-floor cooling unit 160, a modular cooling plant 222 can be connected to a number of on-floor cooling units 160, as shown in FIG. 2A, with the on-floor cooling units 160 connected in parallel to the modular cooling plant 222. Each modular cooling plant 222 can serve, for example, 12 or more on-floor cooling units 160. Furthermore, system 100 can have a number of modular cooling plants 222. System 100 can be, for example, a building using 30 megawatts (MW) of electrical power. There can then be a number of modular cooling plants 222 connected to the building, for example fifteen modular cooling plants 222 each providing cooling for each 2 MW of electrical power used by the data center.

The modular cooling plants 222 and on-floor cooling units 222 can be connected through ladder pipes 244. Supply line 246 can supply cool water to the on-floor cooling units, while return line 248 can return warm water to the modular cooling plants 222 to be cooled. Along at least one pipe is a corresponding control valve 224 located so that flow to a single cooling unit can be controlled. The modular cooling plant 222, corresponding cooling units 160, and control valves 224 can together be called a module 230. Each control valve 224 can control the flow of water through the corresponding on-floor cooling unit 160 without affecting the other cooling units in the module. The control valves 224 can provide only the water that the particular on-floor cooling unit 160 needs. That is, the control valve 224 can be a proportioning valve rather than a digital "on" or "off" type control valve. Each control valve 224 can have a motor (not shown) that can turn the corresponding valve such that it is open as wide as necessary to circulate the needed water through the corresponding on-floor cooling unit 160. A controller can control the motor. There can be, for example, one master controller to control all of the control valves 224. Alternatively, each control valve 224 can have a corresponding controller to independently control each motor. In some implementations, a master controller can control all of the individual controllers. The controllers can control the control valves 224 to respond to the leaving air temperature (LAT) or other local variables of each cooling unit 160. For example, the controllers can control the control valves 224 to respond to a change in the difference between the leaving air temperature and the entering water temperature. Each control valve 224, and thus each on-floor cooling unit 160, can act independently of another valve 224 or on-floor cooling unit 160. That is, all increases or decreases in flow through system 100 can be local through controllers at each corresponding on-floor cooling unit 160.

By designing system 100 such that the amount of water to each on-floor cooling unit 160 is individually controlled and such that all of the modular cooling plants 222 are connected to a common header, water from the system can be distributed to the load in system 100 rather than flowing a constant amount of water through the entire system 100. In this way, water that is not needed for one on-floor cooling unit 160 can be made available to another on-floor cooling unit 160. Because the on-floor cooling units 160 act independently, there can be a large number of on-floor cooling units 160 in system 100, for example over 1,000 cooling units. Further, the system 100 can be designed such that cooled air from multiple cooling units 160 can mix between the time it leaves cooling coils 112a, 112b and is drawn into the servers 102a, 102b, such as by using higher ceiling to exhaust the cooled air from the fan 110 and cooling coils 112a,112b into the space above the servers 102a, 102b. Having such a design ensures that if one on-floor cooling unit 160 fails, e.g. as a result of control valve 224 flowing too much or too little water to the respective on-floor cooling unit 160, the other on-floor cooling units 160 can compensate to cool the data center 101. Moreover, system 100 can be designed such that if one modular cooling plant 222 fails, other modular cooling plants 222 along the same header can take the load. Such a design can allow for the cooling of large numbers of servers. For example, system 100 can include over 1,000 cooling units and corresponding server racks.

Optionally, a few chillers 130 can be available for use by the system 100. A separate chiller header 228 may be provided which connects one chiller to multiple modular cooling plants 222. Operation of system 100 may switch some or all of the chillers 130 on during times of extreme atmospheric ambient (i.e., hot and humid) conditions or times of high heat load in the data center 101. Referring back to FIG. 1, controlled mixing valves 134 are provided for electronically switching to the chiller circuit, or for blending cooling water from the chiller circuit with cooling water from the condenser circuit. Pump 128 is able to supply tower water to chiller 130, and pump 132 is able to supply chilled water, or cooling water, from chiller 130 to the remainder of system 100. Chiller 130 can take any appropriate form, such as a centrifugal, reciprocating, or screw chiller, or an absorption chiller.

The chiller circuit can be controlled to provide various appropriate temperatures for cooling water. The chilled water may be supplied from chiller 130 at temperatures elevated from conventional chilled water temperatures. For example, the chilled water may be supplied at temperatures of 55° F. (13° C.) to 70° F. (18 to 21° C.) or higher. For example, the water supply temperature can be between 60-64° F., 65-70° F., 71-75° F., or 76-80° F. The water may then be returned at higher temperatures, such as 59 to 176° F. (15 to 80° C.). In this approach that uses sources in addition to, or as an alternative to, free cooling, increases in the supply temperature of the chilled water can also result in substantial efficiency improvements for the system 100.

Referring to FIG. 2A, because the chillers 130 are on a separate circuit 228 from the modules 230, the chillers 130 can be shared among modules 230. Such an arrangement can be beneficial when a modular cooling plant 222 or chiller 130 fails. Because the chillers 130 are shared among modules 160, any chiller 130 can supply chilled water to keep the module 160 functioning when either one chillers fails or when a corresponding modular cooling plant 222 fails. Thus, the system 100 can become more robust as more modules 160 and more chillers 130 are added, as described further herein. Furthermore, the number of chillers 130 can be less than the number of modules 230 to reduce costs. Valves between the chillers and the modular cooling plants 222 can control which chiller supplies chilled water to which modular cooling plant 222. Although not shown, and although on separate headers from the modules 230, the chillers 130 can be housed in some or all of the modules 222.

Referring back to FIG. 1, pumps 120, 124, 128, 132, may be provided with variable speed drives. Such drives may be electronically controlled by a central control system to change the amount of water pumped by each pump in response to changing environmental conditions or changing conditions such as equipment failure or a new set point in system 100. For example, pump 124 may be controlled to maintain a particular temperature in workspace 106, such as in response to signals from a thermostat or other sensor in workspace 106.

Figure 2B:
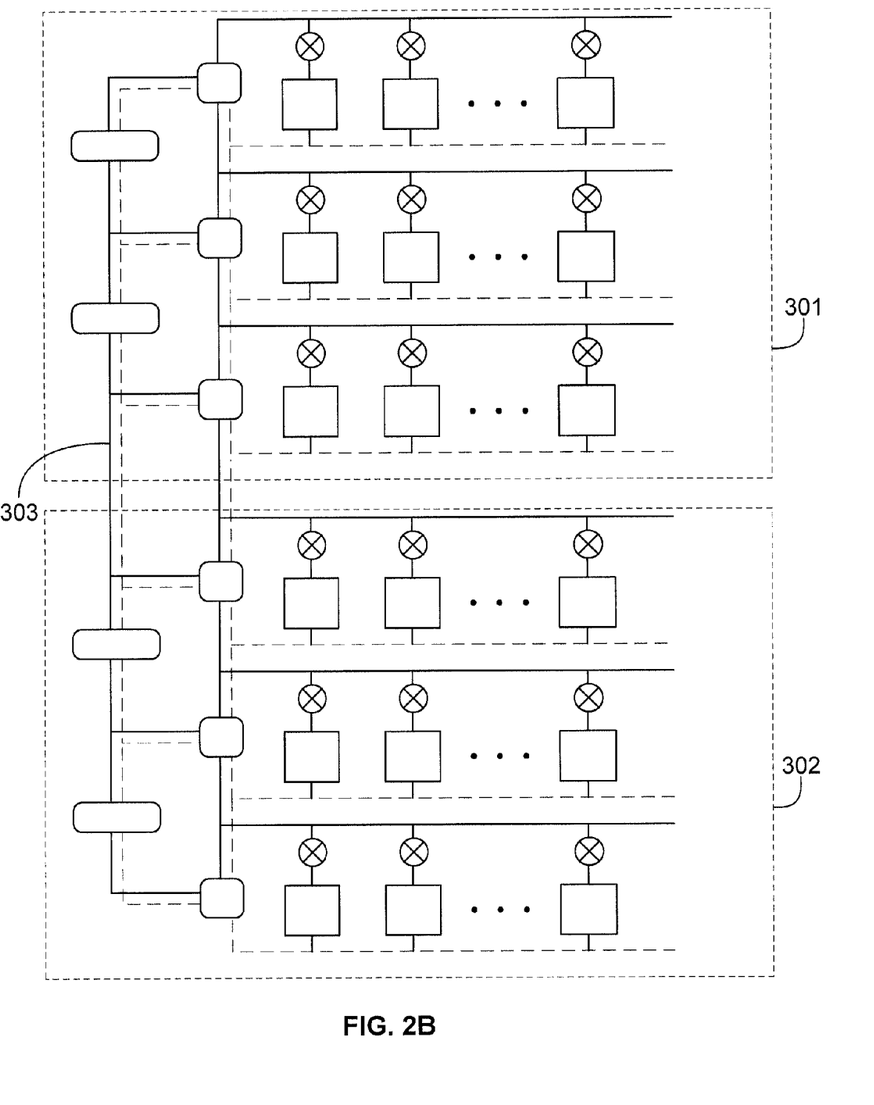
FIG. 2B is a schematic diagram showing two different plants, each having a system for cooling server racks in a data center.

As shown in FIG. 2B, system 100 can be highly modular, and can therefore be scaled from a very small system to a very large system by adding additional components and subsystems. Because system 100 is modular, the data center can be expanded as capacity is needed while maintaining operation of the plant during construction. A first set of racks of electronic equipment, for example, racks of servers, and associated modular cooling plants and optional chillers can be installed and operation of the equipment can be initiated. As more electronic equipment is needed and received, a second set of the electronic equipment and associated modular cooling plants are installed and placed online. The modular cooling plants associated with the first set of equipment can be fluidly coupled to the modular cooling plants associated with the second set of equipment to provide the backup cooling in the event of failover. Furthermore, although existing plant 301 and future plant 302 are shown as separate systems, connections, such as connection 303, can be made between the two plants in order to share components. While sharing components between old and new systems may cause construction-based interruptions in the existing system, it may also provide for better utilization of the components in the full system. For example, chillers 130 can be extended to be shared among both plants 301 and 302.

In operation, system 100 may respond to signals from one or more sensors 192 placed in system 100. The sensors may include, for example, thermostats, humidistats, flowmeters, and other similar sensors. In one implementation, one or more thermostats may be provided to monitor the temperature inside the data center. In some embodiments, air adjacent to an on-floor cooling unit 160 is partially isolated from air adjacent to a neighboring on-floor cooling unit 160. A single on-floor cooling unit 160 cools heated air generated by the servers in the associated workspace. The sensors 192 can measure the leaving air temperature, defined as the temperature leaving the cool air coils 112a, 112b or the cool air plenum 108. To measure the leaving air temperature, the one or more sensors 192 can be placed, for example, next to the cool air coils 112a, 112b or the cool air plenum 108 of each on-floor cooling unit 160.

As shown in FIG. 1, a single temperature sensor 192 can be used for each on-floor cooling unit 160. Alternatively, an array of sensors, such as between two and ten sensors, for example four sensors, may be used for each on-floor cooling unit and the average temperature, such as the average leaving air temperature, determined. While other implementations may include placing multiple thermostats throughout system 110, such as in the warm air plenums 104a, 104b or near the servers 102a, such temperatures tend to vary. Measuring the leaving air temperature may therefore be a more robust method of controlling system 100.

The leaving air temperature measured by the thermostats can be used to control the valves 224 associated with the on-floor cooling units 160. Further, although in some implementations, the pumps 120, 124, 128, 132 are fixed speed pumps, in other implementations, the temperature reading from the thermostats may be used to control the speed of associated pumps. When the leaving air temperature begins to rise above an inside setpoint, the control valves 224 can be open wider or the pumps 120, 124, 128, 132 can run faster to provide additional cooling water. Such additional cooling water can reduce the leaving air temperature. The leaving air temperature can also be used to indirectly effect the server fans. That is, for computers that regulate their fan speed based on how hard the server is working, controlling the cooling unit leave air temperature to eliminate hot spots in the work area 106 can allow those servers to run their fans slower, thereby using less energy that would otherwise be required.

When additional water is circulated through system 100 as a result of the valves 224 opening or the pumps 120, 124, 128, 132 pulling more water, the pressure differential between the supply 246 and return 248 ladders falls, requiring the pumps 120, 124, 128, 132 to settle on a lower pressure equilibrium than usual (called "riding the pump curve"), whereby the pressure drop across the cooling units matches the pressure differential of the pumps. As excess water is drawn from modular cooling plant 222, the modular cooling plant 222 may not be able to maintain a predetermined water supply temperature. For example, because the water is cycling through the system more quickly and the environmental temperature is higher, the cooling towers may not have sufficient time to kick off heat from the water to the environment than when the external temperature is lower. As a result, water that is warmer than the predetermined water supply temperature is circulated through system 100.

The potentially negative result of circulating water that is warmer than the predetermined water supply temperature through an on-floor cooling unit 160, that is, of less cooling ability of the water flowing through the cooling unit 160, however, can be more than offset by the positive result of flowing extra water through the on-floor cooling unit 160. Thus, the resulting leaving air temperature can be brought down below the inside setpoint. In some embodiments, while the cooling water supplied to on-floor cooling units 160 may be 1 degree warmer than the predetermined water supply temperature, the resulting leaving air temperature may be more than 1 degree cooler than the inside setpoint.

Controllers may also be used to control the speed of various items such as fan 110 to maintain a set pressure differential between two spaces, such as attic 105 and workspace 106, and to thereby maintain a desired airflow rate. Where mechanisms for increasing cooling, such as speeding the operation of pumps, are no longer capable of keeping up with increasing loads, a control system may activate chiller 130 and associated pumps 128, 132, and may modulate control valves 134 accordingly to provide additional cooling.

System 100 may also respond to signals from outside data center 101, e.g. to the temperature outside the data center 101 (which can correlated to and monitored by the temperature of water supplied from the cooling tower). Thermostats may be used to monitor the temperature outside the data center 101. When the temperature, e.g. either the air temperature or the wetbulb temperature, outside of the data center 101 is below a predetermined value, water that is cooled in the cooling tower is at least as cool as a predetermined water supply temperature. This cooled water can be circulated through system 100 in order to keep the temperature inside the data center 101, for example the leaving air temperature of each on-floor cooling unit 160, below an inside setpoint. The inside setpoint can be, for example, less than 120° F., such as less than 115° F. or less than 110° F., such as 75° F. to 85° F. and can vary throughout the year, as discussed below. Federal OSHA and California OSHA guidelines may also provide limitations on the inside setpoint. Furthermore, the setpoint might vary by geographical location to take into account the average temperature and humidity in the respective location. When the temperature outside the data center 101 rises above the predetermined value, water that is warmer than the predetermined water supply temperature can be circulated through system 100, thus causing the temperature inside the data center 101 to rise above the inside setpoint. The data center 101 can be rated to run on water having a temperature that is less than the predetermined water supply temperature, i.e. data center 101 may have sufficient water resources to keep the leaving air temperature below a predetermined temperature and in some cases, to keep the water temperature in system 100 less than the predetermined water supply temperature.

In one implementation, supply temperatures for cooling water can be between 65° F. and 70° F., such as 68° F. (20° C.), while return temperatures can be between 100° F. and 110° F., such as 104° F. (40° C.). In other implementations, the supply water can be supplied at temperatures of 50° F. to 84.20° F. or 104° F. (10° C. to 29° C. or 40° C.) and the return water can be supplied at temperatures of 59° F. to 176° F. (15° C. to 80° C.) for return water. The temperature of the water supplied by the cooling tower may be generally slightly above the wet bulb temperature under ambient atmospheric conditions, while the temperature of the water returned to the cooling tower will depend in part on the heat inside building 101.

Using these parameters and the parameters discussed above for entering and exiting air, relatively narrow approach temperatures may be achieved with the system 100. The approach temperature, in this example, is the difference in temperature between the air flowing away from a coil and the water entering a coil. The approach temperature is always positive because the water entering the coil is the coldest water, and the water warms as it travels through the coil. As a result, the water can be appreciably warmer by the time it exits the coil. Air passing over the coil near the water's exit point is warmer than air passing over the coil at the water's entrance point. Because even the most-cooled exiting air at the cooling water's entrance point is warmer than the entering water, the overall exiting air temperature is at least somewhat warmer than the entering cooling water temperature.

Keeping the approach temperature small permits a system to be run on free, or evaporative, cooling for a larger portion of the year and reduces the size of a chiller used with the system, if any chiller is needed at all. To lower the approach temperature, the cooling coils may be designed for counter-flow. In counter-flow, the warmest air flows near the warmest water and the coolest air exits near where the coolest water enters.

In certain implementations, the entering water temperature may be 64° F. (18° C.) and the exiting air temperature 77° F. (25° C.), as noted above, for an approach temperature of 13° F. (7° C.). In other implementations, wider or narrower approach temperature may be selected based on economic considerations for an overall facility.

With a close approach temperature, the temperature of the cooled air leaving the coil closely tracks the temperature of the cooling water entering the coil. As a result, the air temperature can be maintained, generally regardless of load, by maintaining a constant water temperature. In an evaporative cooling mode, a constant water temperature can be maintained as the wet bulb temperature stays constant (or changes very slowly), and by blending warmer return water with supply water or modulating cooling tower fans as the wet bulb temperature falls. As such, active control of the cooling air temperature can be avoided in certain situations, and control can occur simply on the cooling water return and supply temperatures.

Figure 3:
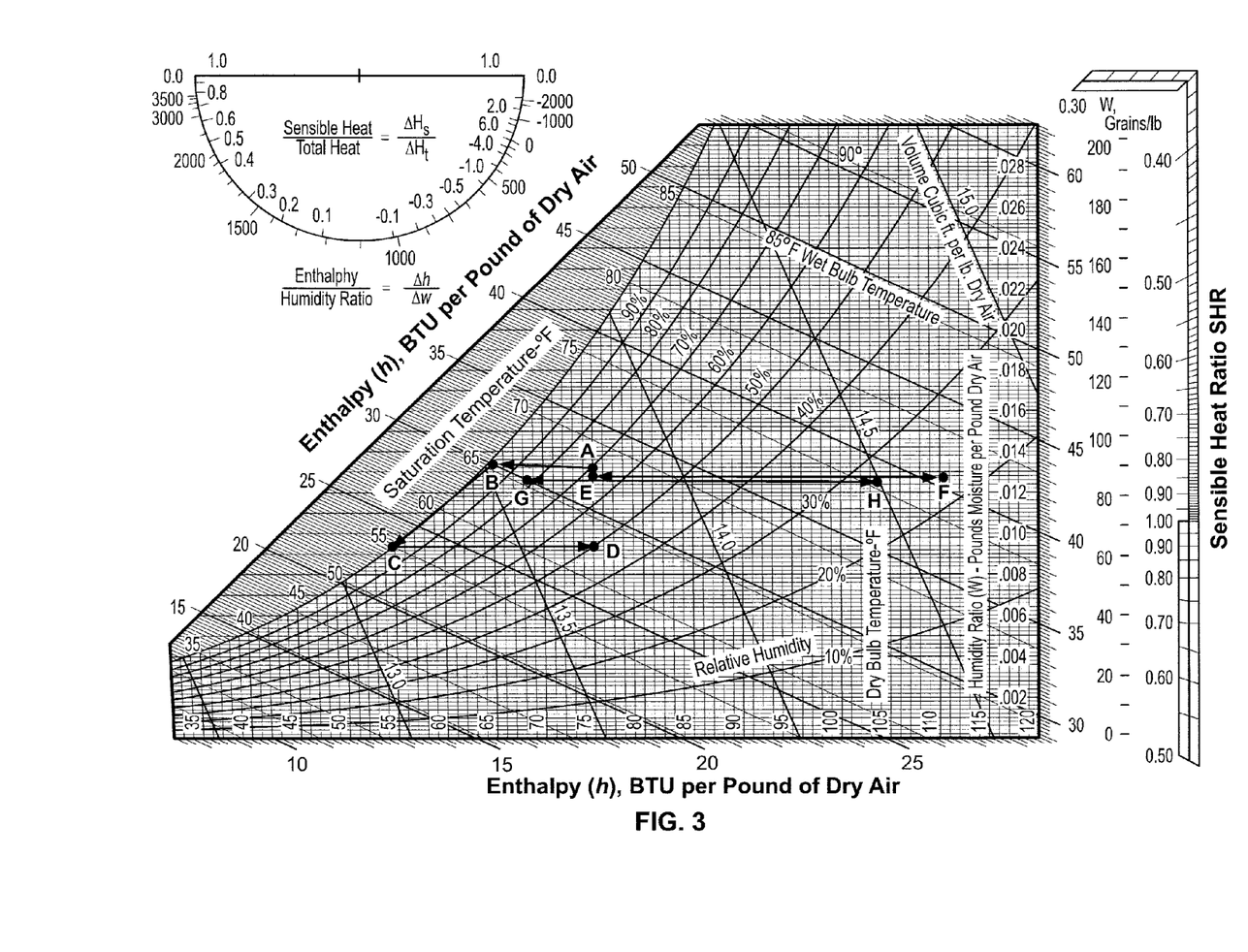
FIG. 3 is a psychometric chart showing a heating and cooling cycle for air in a data center.

FIG. 3 is a psychrometric chart showing a heating and cooling cycle for air in a data center. A psychrometric chart graphically represents the thermodynamic properties of moist air (which is air containing any appreciable moisture, and not merely air that would feel moist to a person). The chart is from ASHRAE Psychrometric Chart No. 1, which defines properties of air for sea level applications. See 1997 ASHRAE Handbook—Fundamentals, at page 6.15. Other charts may also be used, and the chart shown here is merely used to exemplify certain aspects of the concepts discussed in the present document.

The psychrometric chart is criss-crossed with a number of lines that represent various properties of air. Cooling and heating processes on air can be analyzed by identifying a point on the chart that represents air at a particular condition (e.g., temperature and humidity), and then locating another point that represents the air at another condition. A line between those points, generally drawn as a straight line, may be fairly assumed to represent the conditions of the air as it moves from the first condition to the second, such as by a cooling process.

Several properties will be discussed here. First, saturation temperature is an arc along the left of the graph and represents the temperature at which air becomes saturated and moisture begins coming out of the air as a liquid—also known popularly as the "dew point." When the temperature of air is taken below the dew point, more and more water comes out of the air because the cooler air is capable of holding less water.

The dry bulb temperature of air is listed along the bottom of the graph and represents what is popularly viewed as temperature, i.e., the temperature returned by a typical mercury thermometer.

The chart shows two numbers relating to the humidity of air. The first is the humidity ratio, listed along the right edge of the graph, and is simply the weight of moisture per each unit weight of dry air. Thus, the humidity ratio will stay constant at various temperatures of air, until moisture is removed from the air, such as by pushing the air temperature down to its dew point (e.g., the moisture comes out of the air and ends up on the grass in the morning) or by putting moisture into the air (e.g., by atomizing water into such as fine mist in a humidifier that the mist can be supported by the natural motion of the air molecules). Thus, when graphing processes that involve simple changes in air temperature, the point that represents the state of the air will move straight left and right along the graph at a constant humidity ratio. That is because the dry-bulb temperature will go up and down, but the humidity ratio will stay constant.

The second humidity parameter is the so-called relative humidity. Unlike the humidity ratio, which measures the absolute amount of moisture in the air, the relative humidity measures the amount of moisture in the air as a percent of the total moisture the air could possibly hold at its current temperature. Warmer air can hold more moisture than can colder air, because the molecules in warmer air are moving more rapidly. Thus, for an equal amount of moisture in the air (i.e., an equal humidity ratio), the relative humidity will be lower at a high temperature than at a low temperature.

As one example, on a summer day when the overnight low was 55 degrees Fahrenheit and there is dew on the ground, and the daytime high is around 75 degrees Fahrenheit, the relative humidity in the early morning will be about 100% (the dew point), but the relative humidity in the afternoon will be a very comfortable 50%, even if one assumes that the identical amount of water is in the air at both times. This exemplary process is shown in FIG. 3 by the points marked C and D, with point C showing saturated air at 55 degrees Fahrenheit (the overnight low), and point D representing that same air warmed to 75 degrees Fahrenheit (the daytime temperature).

Commercial air handling systems take advantage of this same process in providing conditioned air in a building. Specifically, systems may gather air from an office space at 75 degrees Fahrenheit and a relative humidity of 60 percent. The systems pass the air through a cooling coil that looks like an automobile radiator to cool the air to 55 degrees Fahrenheit, which will typically push the air down to its dew point. This will make moisture pour out of the air as it passes through the cooling coil. The moisture can be captured in drains below the cooling coil and then be removed from the building. The air can then be returned to the work space, and when it warms back to 75 degrees, it will be a very comfortable 50 percent relative humidity.

This common cooling process is shown by points A, B, C, and D on the chart of FIG. 3. Point A shows the 75 degree air at 70 percent relative humidity. Point B shows the air cooled to its dew point, which it hits at a temperature (dry bulb) of about 65 degree Fahrenheit. Further cooling of the air to 55 degrees Fahrenheit (to point C) rides along the saturation curve, and water will come out of the air during that portion of the cooling. Finally, the state of the air moves to point D as the air is warmed and reaches 75 degrees Fahrenheit again. At this point, the relative humidity will be 50 percent (assuming it does not pick up additional moisture from the room or the existing room air) rather than the original 60 percent because the cooling process has dehumidified the air by pulling moisture out of the air in the cooling coil. If the room air contains more moisture than does the cooled air, point D will be slightly above its position shown in FIG. 3, but still below point A.

Such a common process brings with it a number of challenges. First, to cool the air to 55 degrees Fahrenheit, the system must provide cooling water in the cooling coil that can absorb all the heat. Such water would need to be at least cooler than 55 degrees Fahrenheit. It may be expensive to create such cool water—requiring systems such as chillers and other energy-intensive systems. In addition, the area immediately around the pipes that supply the cooling water will be cooler than 55 degrees Fahrenheit, i.e., cooler than the dew point of the air if the pipes run through the workspace or through air having the same state as the air in the workspace. As a result, moisture from the air may condense on the pipe because the temperature of the surrounding air has fallen to its dew point. Thus, insulation may be required around the cool pipes to prevent such condensation, and condensation might occur in any event, and cause rusting, mold, water pooling, or other problems. Finally, it takes a lot of energy to dehumidify, i.e., to change the water from one state to another.

The warm air cooling features discussed with respect to FIG. 1 above may, in certain implementations, avoid one or more of these challenges. An exemplary warm air cooling process is shown on the graph of FIG. 3 by points E and F. Point E shows a room-air condition in a workspace that is near the top of, but within, common guidelines for comfort levels for people dressed in summer clothing. See 1997 ASHRAE Handbook—Fundamentals, at page 8.12. That condition is 75° F. (24° C.), and a relative humidity of about 70 percent (the same as Point A in the prior example). Point F shows heating of that air without the addition of moisture, such as by passing the air over heat-generating computer components in a rack-mounted server system. The temperature rise is 36° F. (20° C.) to bring the air to a state of 111° F. (44° C.) at about 23 percent relative humidity. The air may then be cooled to its original temperature (point E) of 75 degrees Fahrenheit in a cooling coil before it is re-introduced to the work space, without adding water to or removing water from the air.

Points G and H on the graph represent the condition of air in the space immediately surrounding cooling pipes. It is assumed for this example that the cooling supply water is 68 degrees Fahrenheit (20 degrees Celsius) and the return temperature is 104 degrees Fahrenheit (40 degrees Celsius). It is also assumed that the air near the pipes will contain the same moisture level as the rest of the air in the space, and that the air immediately surrounding the pipe takes on the same temperature as the water inside the pipe. As can be seen, this air associate with the cooling water also stays above the saturation point, so that there should be no condensation on the cooling water pipes, and thus no need for insulation to prevent condensation on the pipes.

It can be seen by this process that the air never becomes saturated. As a result, the system need not provide energy to create a phase change in the air. In addition, the system need not provide liquid recovery structures at the cooling coil, or pipe insulation for anywhere. Other similar temperatures, and in many implementations warmer temperatures, may be used. The particular temperatures discussed here are meant to be exemplary only.

Figure 4:
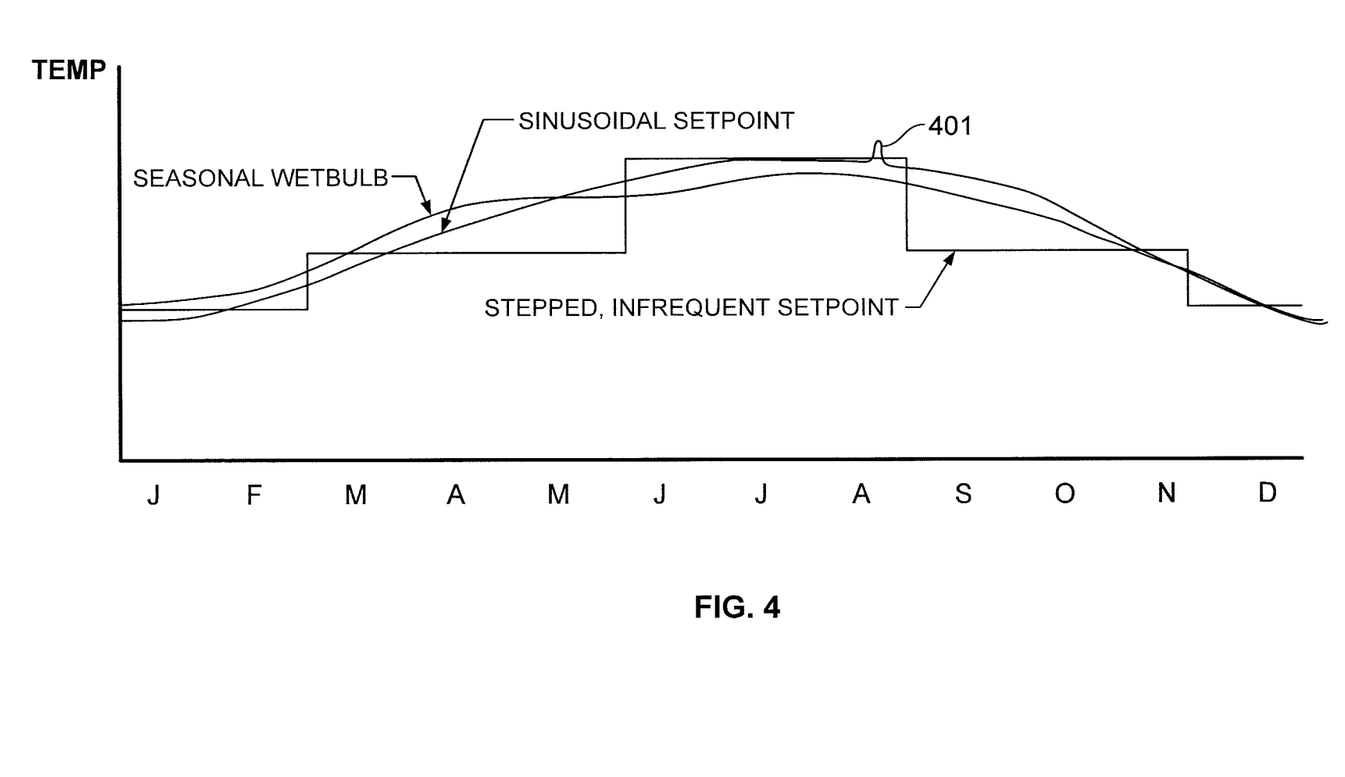
FIG. 4 is a graph of setpoint temperature for a computing facility over a one year time period.

FIG. 4 is a graph of an inside setpoint temperature for a computing facility over a one year time period. The inside setpoint temperature may be a temperature in a work space such as work space 106 in FIG. 1. As shown in the stepped graph, the inside setpoint temperature (i.e., a targeted temperature) is adjusted infrequently, such as seasonally or monthly, so as to more closely track expected outdoor wet-bulb temperatures. The inside setpoint is increased in the summer because the lower winter inside setpoint may be effectively unattainable in warm summer weather by using only evaporative cooling. Thus, while a "best," i.e. lower temperature such as 71° F. (22° C.), inside setpoint temperature applies in the winter, that same inside setpoint is not realistic, in the example, in summer months.

The inside setpoint may be manually set by a user and can be adjusted infrequently so as to better approximate a setpoint that is attainable using evaporative cooling techniques with little or no assistance from chillers or other similar components that require relatively high levels of energy to operate. Although increasing the inside setpoint during warmer times of the year may increase the typical operating temperature, it also decreases the amount of thermal cycling that may occur in a facility, and thus lengthen the life of electronic components in the facility. In contrast, if the setpoint is kept as low as possible, the conditioned space would be relatively cool on days having a low wet bulb temperature and relatively warm on days having a high wet bulb temperature. Thus, keeping a constant setpoint throughout the year may actually increase thermal cycling, particularly in warmer months—as the system is able to maintain the setpoint on some days but not on other days. In another embodiment, the cooling units may be controlled to stabilize the difference between their leaving air temperature and their entering water temperature. By applying resets to the cooling plan setpoints, the air temperature in the work space 106 can be effectively slaved to the temperature of the water from the cooling plant, thereby removing one layer of setpoints to be scheduled.

The setpoint may also be adjusted substantially continuously, such as by varying the setpoint temperature in an annual sinusoidal manner that generally follows the expected outdoor wet bulb temperature, as shown by the sinusoidal setpoint line. Studies have indicated that human discomfort is minimized by providing many minute changes, or continuous changes, to temperature, as opposed to large step variations in temperature. In both examples the setpoint may be maintained, in certain implementations, even if a lower temperature may readily be achieved (e.g., because the outdoor wet bulb temperature is lower than expected) so as to minimize thermal cycling in a facility being cooled.

The particular setpoint temperatures may be selected based on the capabilities of the components in a facility and on prevailing local weather conditions. For example, cool weather setpoints may be in the range of 59-77° F. (15-25° C.), with particular values of 64.4, 68, 71.6, and 75.2° F. (18, 20, 22, and 24° C.). Warm weather setpoints may be in the range of 68-86° F. (20-30° C.), with particular values of 71.6, 75.2, 78.8, and 82.4° F. (22, 24, 26, ad 28° C.). In a particular implementation, warm weather air temperatures in a facility may be approximately 80.6-82.4° F. (27-28° C.) and cold weather temperature may be about 71.60° F. (22° C.). The time for resetting the setpoint may also vary, and may be weekly (e.g., using a long range weather forecast to select an achievable setpoint that tracks the predicted wet bulb temperature), weekly, monthly, or quarterly, for example.

When the wet bulb or air temperature gets too high to achieve the desired inside set point, the temperature of the cooling water may be allowed to drift upward with the outside temperature, causing the temperature in space 106 to move upward also. If the outside temperature rises above a predetermined value, as discussed above, then the temperature inside the data center 101 can be allowed to rise above an inside setpoint, as shown by area 401 in FIG. 4. This rise in the temperature inside the data center can be achieved, as discussed above, by flowing warm water, that is water that is warmer than a predetermined water supply temperature through system 100. Correspondingly, more water can be circulated through system 100 in order to carry the heat away faster and to compensate for the warm water circulated through the system.

The rise in temperature inside the data center 101 over the inside setpoint can be limited in time, for example to less than 10% of the operating time of the data center or the equipment, such as less than 5%, less than 1%, or less than 0.5% of the operating time. Likewise, the amount of time that warm water is circulated through the system 100 can be limited in time, for example to less than 1000 hours per year, less than 500 hours per year, less than 100 hours per year, or less than 50 hours per year. If the temperature inside the data center 101 is over the inside setpoint for more than 10% of the operating time of the data center or the equipment or if warm water is circulated for more than 1000 hours per year, the electronic equipment may fail more quickly than desired. For example, the electronic equipment may fail more quickly after running warm water 15% of the annual operating time of the data center or equipment or for 1500 hours.

Figure 5:
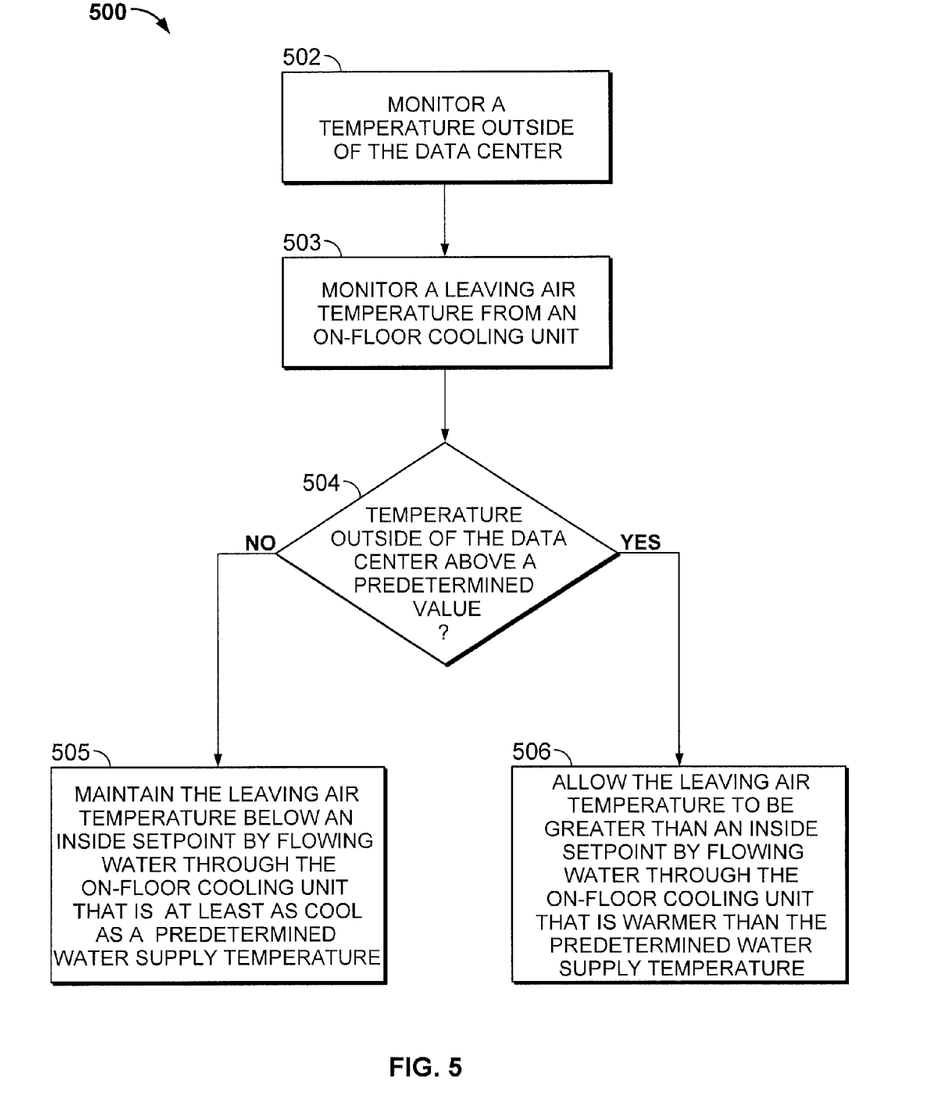
FIG. 5 is a flowchart showing steps for cooling a data center by measuring the leaving air temperature and accounting for elevated temperatures during limited times of the year.

FIG. 5 is a flowchart 500 showing steps for cooling a data center using one or more periods of elevated temperatures. The method is exemplary only; other steps may be added, steps may be removed, and the steps may be performed in different orders than those shown, as appropriate. The temperature outside of the data center is monitored (step 502). The leaving air temperature from the data center is monitored (step 503). A determination is made as to whether the temperature outside the data center is above a predetermined value (step 504). When the temperature outside of the data center is not above a predetermined value, the leaving air temperature can be maintained below an inside setpoint by flowing cool water through a cooling system within the data center (step 505). That is, water that is at least as cool as a predetermined water supply temperature is circulated through the data center. When the temperature outside of the data center rises above the predetermined value, the leaving air temperature can be allowed to be greater than the inside setpoint by flowing water through the cooling system that is warmer than the predetermined water supply temperature (step 506).

Figure 6:
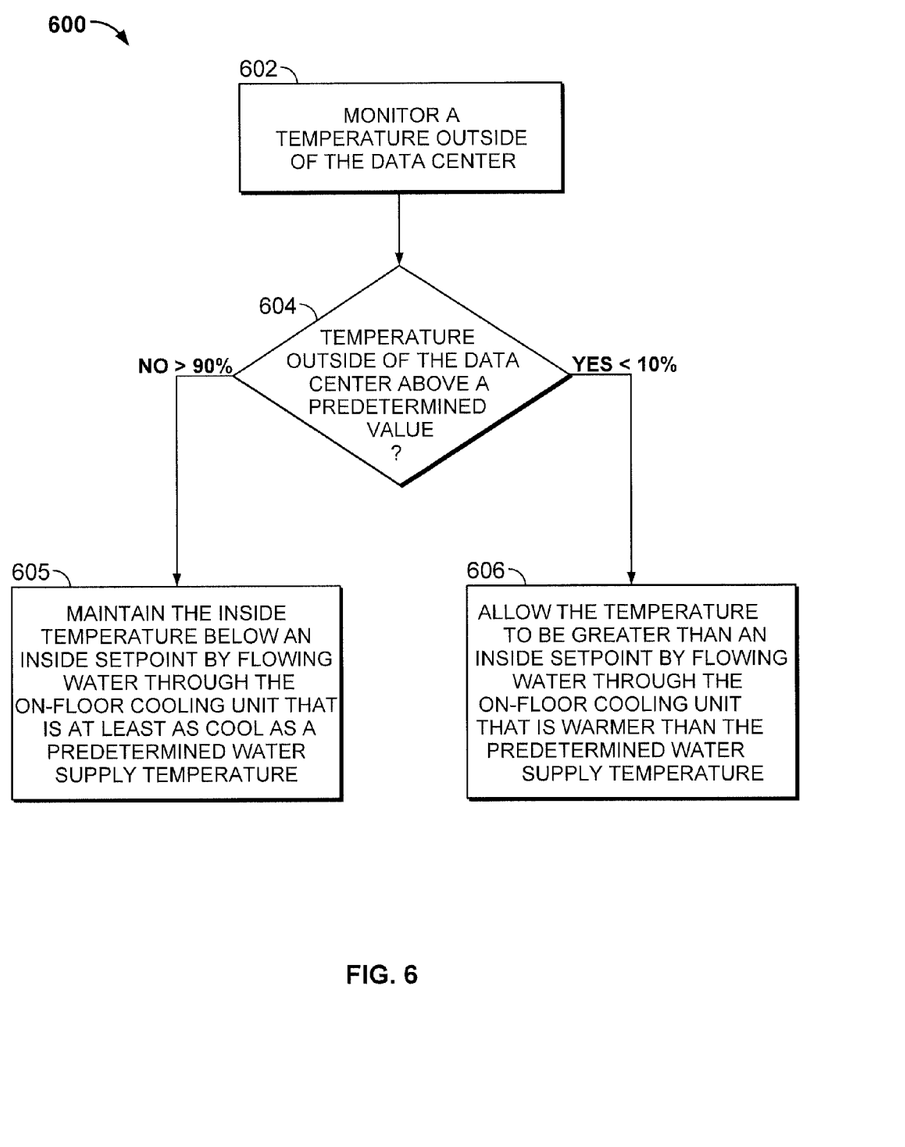
FIG. 6 is a flowchart showing steps for cooling a data center using one or more periods of elevated temperatures for less than 90% of the operating time of the data center electronic equipment.

FIG. 6 is a flowchart 600 showing steps for cooling a data center using one or more periods of elevated temperatures for less than 90% of the operating time of the data center electronic equipment. The method is exemplary only; other steps may be added, steps may be removed, and the steps may be performed in different orders than those shown, as appropriate. The temperature outside of the data center is monitored (step 602). When the temperature outside of the data center is not above a predetermined value, the leaving air temperature can be maintained below an inside setpoint by flowing cool water through a cooling system within the data center (step 605). That is, water that is at least as cool as a predetermined water supply temperature is circulated through the data center. When the temperature outside of the data center rises above the predetermined value, the leaving air temperature can be allowed to be greater than the inside setpoint by flowing water through the cooling system that is warmer than the predetermined water supply temperature (step 606). The temperature can maintained below the inside setpoint for more than 90% of the operating time of the electronic equipment.

Figure 7:
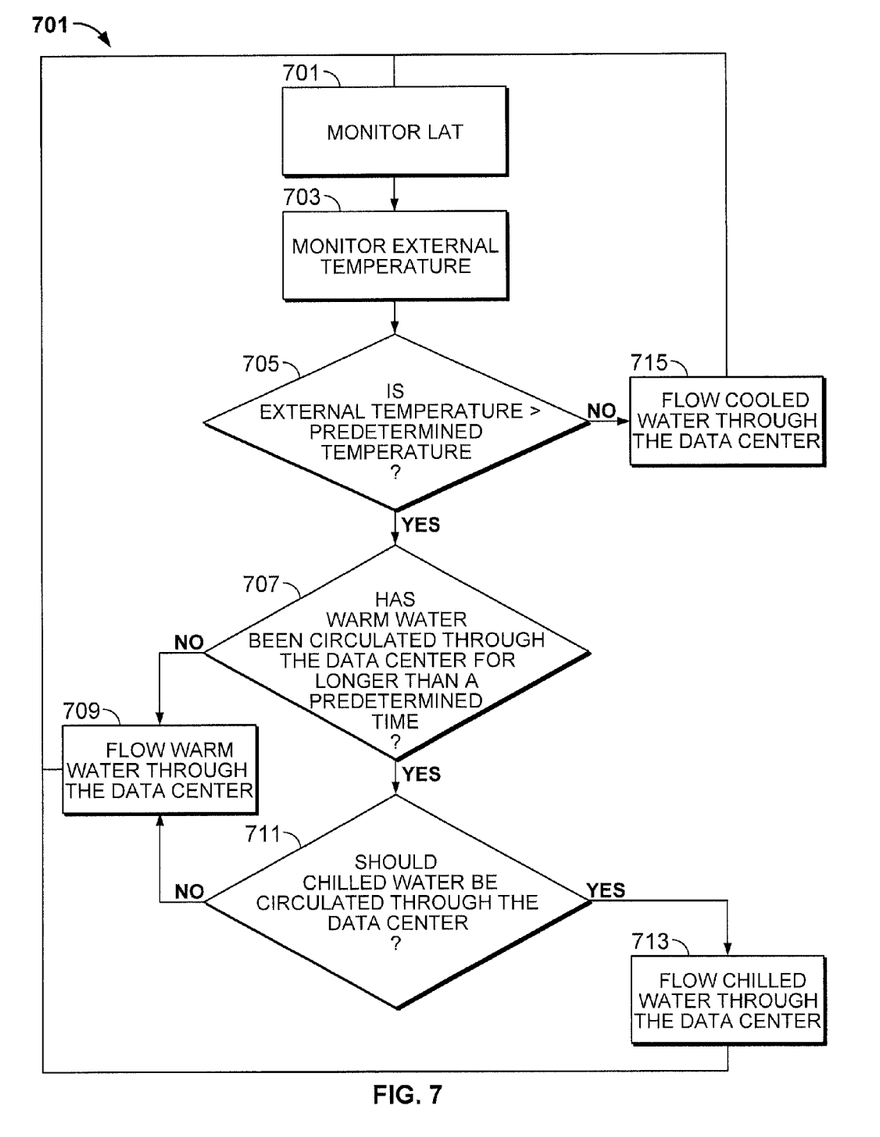
FIG. 7 is a flowchart for cooling a data center having both chilled water and cooled water and using one or more periods of elevated temperatures Like reference symbols in the various drawings indicate like elements.

Chilled water such as from a chiller may be provided through the modular cooling plant. The chilled water may be blended with cool water so that the inside setpoint may be either maintained or allowed to rise for only a predetermined time. FIG. 7 is a flowchart 700 for cooling a data center having both chilled water and cooled water and using one or more periods of elevated temperatures. The method is exemplary only; other steps may be added, steps may be removed, and the steps may be performed in different orders than those shown, as appropriate. The leaving air temperature is monitored from an on-floor cooling unit in the data center (step 701). The external temperature is monitored (step 703). It is determined whether the external temperature is above a predetermined temperature (step 705). If the external temperature is not above the predetermined temperature, then cooled water is flowed through the data center (step 715). Alternatively, if the external temperature is above a predetermined temperature, then it is determined whether warm water has been circulated through the data center for longer than a predetermined time (step 707). If warm water has not been circulated through the data center for longer than a predetermined time, then warm water is continued to be circulated through the data center (step 709). Alternatively, if warm water has been circulated through the data center for longer than a predetermined time, it is determined whether chilled water should be circulated through the data center (step 711). Chilled water is circulated through the data center (step 713).

Furthermore, although not shown, additional fans and local fan speed control can be used to maintain the temperature inside the data center. Additional fans can be used to augment the fans in the trays and cooling units. In one embodiment, the fans can collect air from a plurality of racks. In another embodiment, fans can disperse cooled air to a plurality of racks. In another embodiment, a boost fan can be used to make up for pressure drops in the plenums. For example, referring to FIG. 1, if a suction inlet to the fan 110 is much closer to the warm-air plenum 104a than the warm-air plenum 104b, an additional fan can be provided in the path from the warm-air plenum 104b so that the resulting static pressure in the warm-air plenum 104a and the warm-air plenum 104b is approximately equal. If the boost fan is not used, because of pressure drops traversing the plenum in the attic 105, the static pressures in the warm-air plenum 104a and the warm-air plenum 104b could be sufficiently different to either require larger tray fans in the rack 102b or could overdraw air through the rack 102a. y designing a cooling system as described herein, the efficiency of the system can be improved. For example, allowing the temperature inside the data center to rise above the inside setpoint for short periods of time can minimize the need for chillers. Furthermore, using control valves to individually control the flow of water to each on-floor cooling unit such that only the amount of water as is necessary is used, the total amount of water required for the system is reduced by 10-50%. If the plant is designed to provide enough water for all control valves to be wide open all of the time, to provide water at a temperature below the predetermined water supply temperature, and to provide for water lost due to cleaning and/or evaporation, then the plant would need to have more cool water available than necessary except for the warmest times of the year, for example for 30-40 hours per year. However, by allowing the water temperature to rise during short periods and/or at higher flow requirements, the plant can be designed to require less water. Likewise, cooling with relatively warm water may provide certain benefits when chillers are used. In particular, when a chiller is allowed to provide a smaller temperature change to a coolant, e.g., water, the chiller may provide cooling for less electrical consumption per ton of coolant than if it were required to impart a greater temperature change to the coolant. By having elevated air temperatures in a cooled space, that is, the inside the data center and adjacent to the electrical equipment, the supply water temperature may likewise be higher, and the need for a chiller to cool the water may be less. As a result of these improvements in efficiency and other design parameters discussed herein, the power usage effectiveness (PUE) of the system, that is, the amount of power entering the data center divided by the power used to run the electronic equipment or servers in the data center, can be less than 1.5, for example less than 1.3, or about 1.2.

A number of embodiments have been described. Nevertheless, it will be understood that various modifications may be made without departing from the spirit and scope of what is described. For example, the steps of the exemplary flow chart on FIG. 6 may be performed in other orders, some steps may be removed, and other steps may be added. Accordingly, other embodiments are within the scope of the following claims.

What is claimed is:

1. A system for providing cooled air to a data center, comprising:
   a data center having electronic equipment, wherein the electronic equipment is in operation;
   a cooling water source;
   a plurality of on-floor cooling units in the data center, each on-floor cooling unit configured to cool air warmed by a sub-set of the electronic equipment in the data center;
   a plurality of proportioning control valves, each proportioning control valve associated with a single on-floor cooling unit; and
   a controller, wherein each proportioning control valve is configured to turn in response to a signal from the controller, the valve able to be closed, fully open or partially open, wherein when the valve is closed, water is blocked from the on-floor cooling unit, when the valve is fully open, a maximum volume of water is circulated through the on-floor cooling unit, and when the valve is partially open, some percent less than 100% of the maximum amount of water is circulated through the on-floor cooling unit, and wherein the controller is configured to turn the corresponding control valve in response to a change in temperature.

2. The system of claim 1, wherein the controller is configured to turn the corresponding control valve in response to a change in a leaving air temperature of the corresponding on-floor cooling unit.

3. The system of claim 2, wherein the controller is configured to turn the corresponding control valve such that the leaving temperature of the corresponding on-floor cooling unit remains below an inside setpoint for at least 90% of the operating time of the system.

4. The system of claim 2, further comprising a plurality of sensors, at least one of the sensors configured to measure the leaving air temperature of an on-floor cooling unit.

5. The system of claim 1, wherein the proportioning control valve acts independently of any other control valve.

6. The system of claim 1, wherein the cooling water source comprises a cooling tower.

7. The system of claim 1, wherein each on-floor cooling unit comprises a heat exchanger configured to transfer heat from the electronic equipment to the cooling water source.

8. The system of claim 7, wherein the heat exchanger comprises coils located adjacent to one or more common hot air plenums that receive heated air from the electronic equipment.

9. The system of claim 6, wherein the cooling tower comprises a hybrid cooling tower, the hybrid cooling tower comprising a water-to-water heat exchanger.

10. The system of claim 1, wherein at least one of the plurality of on-floor cooling units comprises one or more fans configured to draw air across the electronic equipment and to maintain a predetermined temperature rise of the air across the electronic equipment.

11. The system of claim 10, wherein the temperature at an exhaust end of the electronic equipment is between about 113° F. and 212° F.

12. The system of claim 1, wherein the plurality of on-floor cooling units are coupled to the cooling water source in parallel such that the cooling water source is operable to provide cooling water to each of the on-floor cooling units simultaneously.

13. The system of claim 4, wherein at least one of the sensors is configured to measure the temperature outside the data center.

14. The system of claim 1, wherein the temperature of cooling water provided to at least one of the on-floor cooling units by the cooling water source is sufficient to inhibit air within the data center from condensing.

15. The system of claim 1, wherein cooling water is provided to at least one of the on-floor cooling units at a temperature of at least about 68° F.

16. The system of claim 1, wherein the cooling water source comprises a cooling water circuit and a condenser circuit, the condenser circuit being configured to remove heat from the cooling water circuit.

17. The system of claim 16, wherein the cooling water circuit comprises a closed-loop circuit.

18. The system of claim 16, wherein the cooling water circuit and the condenser circuit are arranged to form an indirect water-side economizer.

* * * * *